United States Patent [19]
Kim

[11] Patent Number: 5,726,935
[45] Date of Patent: Mar. 10, 1998

[54] FLASH MEMORY DEVICE

[75] Inventor: Dae Hyun Kim, Ichon-Shi, Rep. of Korea

[73] Assignee: Hyundai Electronics Industries Co., Ltd., Kyungki-Do, Rep. of Korea

[21] Appl. No.: 789,087

[22] Filed: Jan. 27, 1997

[30] Foreign Application Priority Data

Jan. 26, 1996 [KR] Rep. of Korea .............. 96-01664

[51] Int. Cl.[6] ............................................. G11C 11/34
[52] U.S. Cl. ............................. 365/185.21; 365/185.2
[58] Field of Search ............................ 365/185.2, 185.21

[56] References Cited

U.S. PATENT DOCUMENTS

| | | | |
|---|---|---|---|
| 5,168,466 | 12/1992 | Kuo et al. | 365/185.21 |
| 5,198,997 | 3/1993 | Arakawa | 365/185.21 |
| 5,543,738 | 8/1996 | Lee et al. | 327/51 |
| 5,572,465 | 11/1996 | Bashir | 365/185.21 |
| 5,646,887 | 7/1997 | Truong et al. | 365/185.21 |
| 5,654,918 | 8/1997 | Hammick | 365/185.2 |

*Primary Examiner*—David C. Nelms
*Assistant Examiner*—Hoai V. Ho
*Attorney, Agent, or Firm*—Fish & Richardson P.C.

[57] ABSTRACT

The present invention relates to a flash memory device and, more particularly, to a flash memory device which can obtain the accurate and rapid current drive ratio by storing current drive ratio for some probable cases in the memory cell in advance, and selecting and using the most proper current drive ratio as required by means of external command.

5 Claims, 3 Drawing Sheets

FLASH MEMORY DEVICE

BACKGROUND OF THE INVENTION

1. Field of the Invention

The present invention relates to a flash memory device and, more particularly, to a flash memory device which can control the current drive ratio of a sense amplifier by external commands.

2. Information Disclosure Statement

In general, in sensing data of a flash EPROM cell, sensing margin is determined by a drive ratio of current flowing through a reference cell.

In a conventional sense amplifier circuit, there is a disadvantage in that in case where the current drive ratio of sense amplifier circuit is incorrectly designed, the sense amplifier circuit or a MASK program operation must be redesigned to adjust it so that a lost in time or economy is caused.

SUMMARY OF THE INVENTION

Therefore, it is the object of the present invention to provide a flash memory device which can solve the above described disadvantage by storing the current drive ratio for some probable cases in the memory cell in advance, and selecting and using the most proper current drive ratio as required by means of external command.

A flash memory device according to the present invention to achieve the above described object comprises a ratio content block for outputting a first to fourth control signal having different current drive ratio according to a plurality of control signals and a select gate input signal inputted from external; a main cell block which takes as inputs said first and second control signals, and which outputs a fifth control signal according to said first and second control signals; a reference cell block which takes as inputs said third and fourth control signals, and which outputs a sixth control signal according to said third and fourth control signals; and a sense amplifier block which takes as inputs said fifth and sixth control signals, and which outputs data.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DETAILED DESCRIPTION OF THE DRAWINGS

The present invention will be described in detail with reference to the accompanying drawings.

Figure 1:
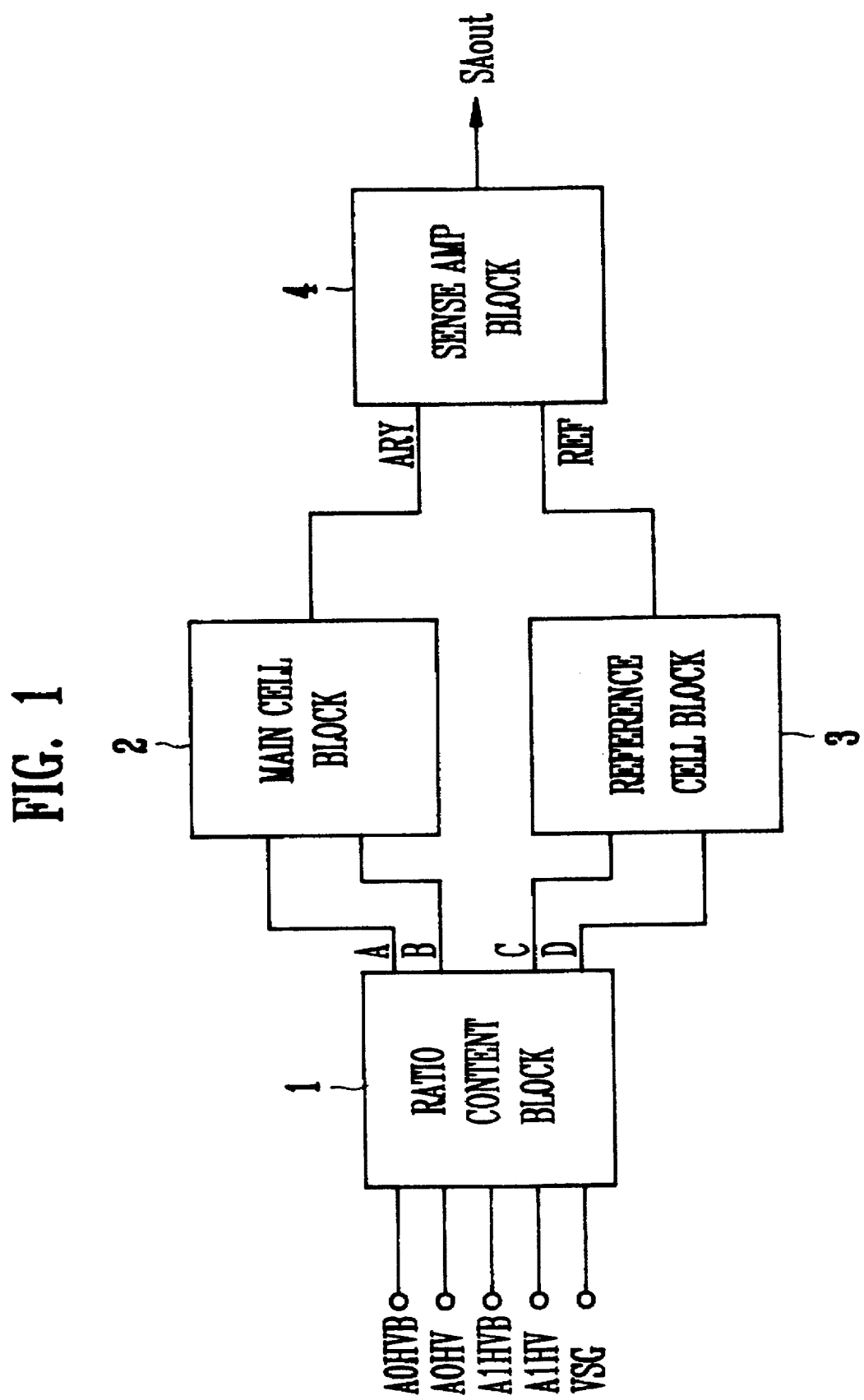
FIG. 1 is a block diagram of a flash memory device according to the present invention.

FIG. 1 is a block diagram of a flash memory device according to the present invention. A ratio content block 1 takes as inputs a plurality of control signals A0HVB, A0HV, A1HVB, A1HV and select gate input signal VSG, and output a first to fourth control signals A to D having different current drive ratio. Among the first to fourth control signals A to D, the first and second control signals A,B are inputted to a main cell block 2 and the third and fourth control signals C,D are inputted to a reference cell block 3. The main cell block 2 outputs a fifth control signal ARY according to the first and second control signals A,B. The reference cell block 3 outputs a sixth control signal REF according to the inputted third and fourth control signals C,D. The fifth control signal ARY and sixth control signal REF are inputted to a sense amplifier block 4. The sense amplifier block 4 compares the inputted fifth and sixth control signals ARY, REF and outputs data to an output terminal SAout.

Figure 2:
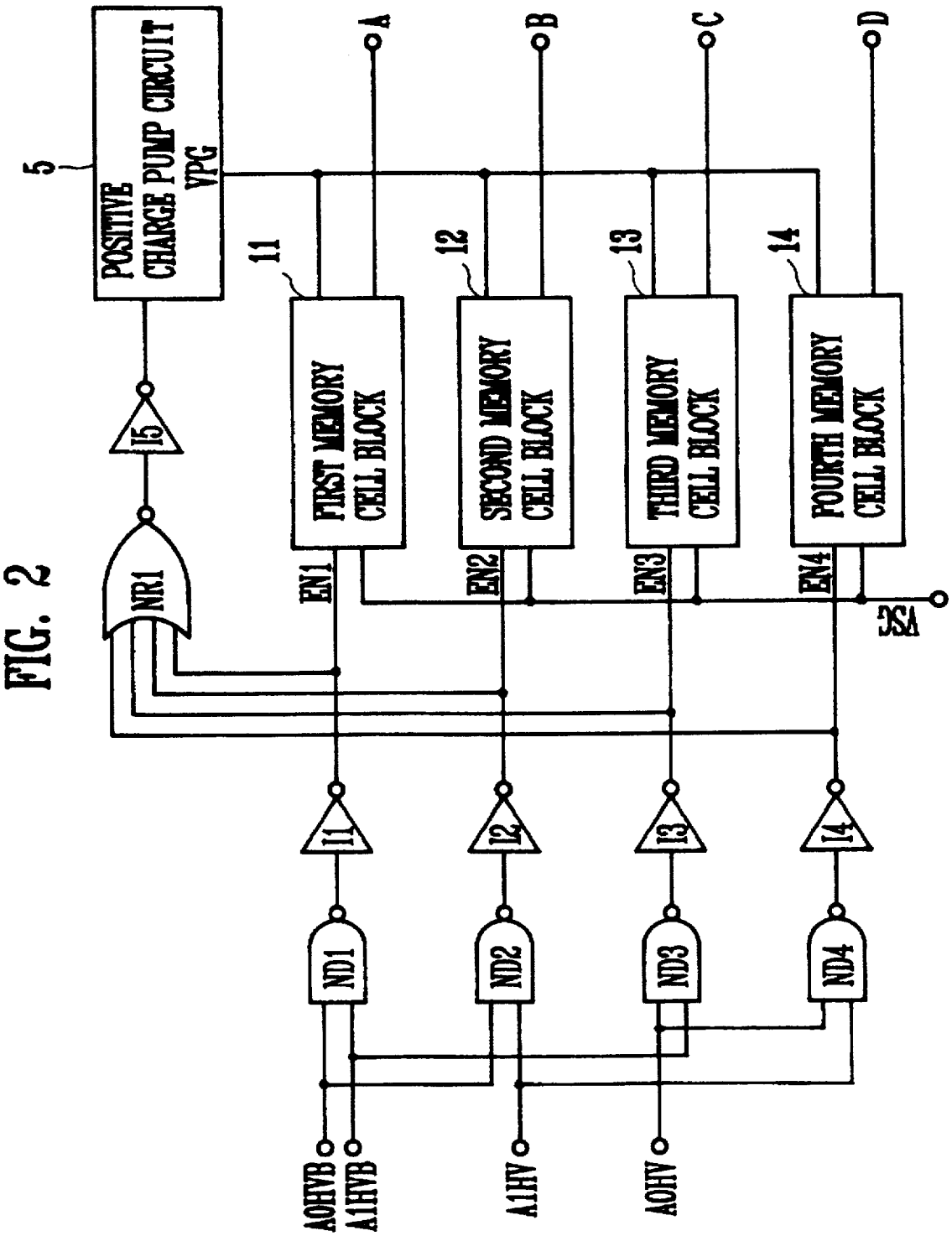
FIG. 2 is a detailed circuit diagram of a ratio content block of FIG. 1.

FIG. 2 is a detailed circuit diagram of a ratio content block of FIG. 1, and the operation of it is as follows.

A plurality of control signals A0HVB, A0HV, A1HVB, A1HV inputted from external are inputted to a first to fourth NAND gates ND1 to ND4 respectively. A first to fourth enable signals EN1 to EN4 which are outputs of the first to fourth NAND gate ND1 to ND4 are selectively outputed according to a first to fourth inverter I1 to I4 according to the inputted plurality of control signals, A0HVB, A0HV, A1HVB, A1HV. The selectively outputted first to fourth enable signals EN1 to EN4 are inputted to a first to fourth memory cell blocks 11 to 14. In addition, the first to fourth enable signals EN1 to EN4 are inputted to a 4-input NOR gate NR1. An output of the 4-input NOR gate NR1 is inputted to a positive charge pump circuit 5 via a fifth inverter 15. At this time, the positive charge pump circuit 5 outputs a program gate voltage VPG according to the output of the 4-input NOR gate NR1. The program gate voltage VPG is inputted to the first to fourth memory cell blocks 11 to 14. Therefore, one memory cell block selected by the first to fourth enable signals EN1 to EN4 is programmed.

Eventually, the first to fourth memory cell blocks 11 to 14 outputs a first to fourth control signals A to D having different current drive ratio according to the plurality of control signals A0HVB, A0HV, A1HVB, A1HV inputted from external.

Figure 3:
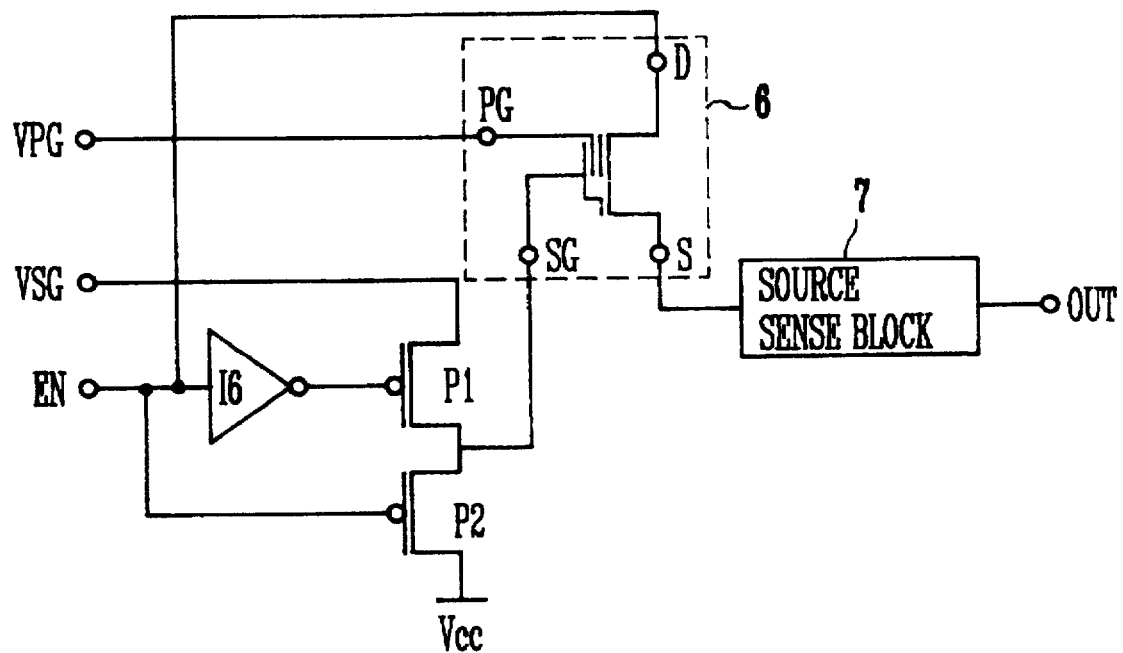
FIG. 3 is a detailed circuit diagram of each memory cell block.

FIG. 3 is a detailed circuit diagram of the memory cell block of FIG. 2. The operation of the memory cell block is described with reference to FIGS. 4A and 4B.

Figure 4A:
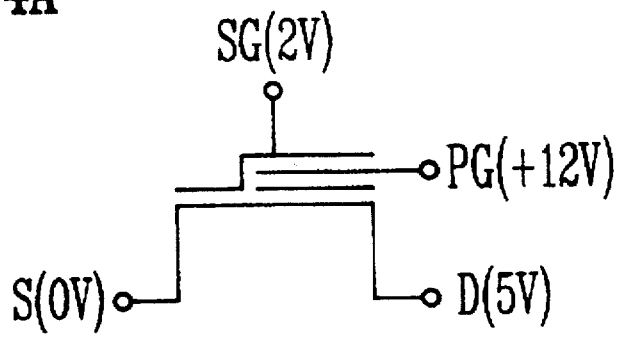
FIG. 4A and 4B are constructional drawings of memory cell showing voltage condition at the time of program or reading operation.

A program enable signal EN becomes HIGH state at the time of programming so that the voltage of high state 5V is supplied to a drain electrode D of a memory cell 6. The program gate voltage VPG is supplied to a program gate electrode PG of the memory cell 6 at the time of programming. Ground voltage 0V inputted from a source sense block 7 is supplied to a source electrode S from a source. In addition, the program enable signal EN and the program enable signal EN which passed through an inverter 16 are respectively inputted to a first and second PMOS transistors P2, P1 serially connected between a power source terminal Vcc and select gate voltage source VSG. At this time, the first PMOS transistor P1 turns on and the second PMOS transistor P2 turns off. Therefore, the program select gate voltage VSG is supplied to a select gate electrode SG of the memory cell 6. That is, as shown in FIG. 4A, to the select gate electrode SG is supplied 2V, to the program gate electrode PG is supplied +12V, to the drain electrode D is supplied 5V, and to the source electrode is supplied 0V so that the memory cell 6 is programmed.

Figure 4B:
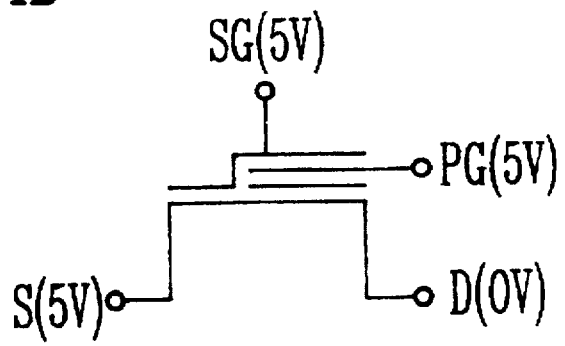

On the other hand, at the time of read operation, the program enable signal EN becomes LOW state. At this time, the first PMOS transistor P1 is turned off, and the second PMOS transistor P2 is turned on. Therefore, the select gate voltage Vcc is supplied to the select gate electrode SG of the memory cell 6 at the time of reading. Therefore, the data of the memory cell 6 is outputted to the output terminal OUT through the source sense block 7. That is, as shown in FIG. 4B, to the select gate electrode SG is supplied 5V, to the program gate electrode PG is supplied 5V, to the drain electrode D is supplied 0V, and to the source electrode is supplied 5V so that the read operation of the memory cell 6 is performed.

As described above, the present invention has an excellent effect that the accurate and rapid current drive ratio can be obtained by storing the current drive ratio for some probable cases in the memory cell in advance, and selecting and using the most proper current drive ratio as required by means of external command.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising:
   a ratio content block for outputting a first to fourth control signal having different current drive ratio according to a plurality of control signals and a select gate input signal inputted from external;
   a main cell block in which said first and second control signals are input, and which outputs a fifth control signal according to said first and second control signals;
   a reference cell block in which said third and fourth control signals are input, and which outputs a sixth control signal according to said third and fourth control signals; and
   a sense amplifier block in which said fifth and sixth control signals inputted, and which outputs data.

2. The flash memory device of claim 1, wherein said ratio content block comprises:
   a first to fourth NAND gates for selectively outputting a first to fourth enable signals according to a plurality of control signals which are inputted from external;
   a NOR gate in which said first to fourth enable signals are input;
   a positive charge pump circuit for outputting a program gate voltage according to an output signal of said NOR gate; and
   a first to fourth memory cell blocks in which output signal of said positive charge pump circuit is input and are programmed according to the output signal of said first to fourth enable signals selectively.

3. The flash memory device of claim 2, wherein said NOR gate is a 4-input NOR gate.

4. The flash memory device of claim 2, wherein said memory cell block comprises:
   a memory cell having a program gate electrode, drain electrode, select gate electrode, and source electrode;
   a first PMOS transistor which is connected between said select gate electrode and select gate voltage source, and in which a program enable signal that passed through an inverter is input;
   a second PMOS transistor which is connected between said select gate electrode and voltage source terminal, and in which said program enable signal is input; and
   a source sense block connected to said source electrode of said memory cell.

5. The flash memory device of claim 4, wherein said select gate electrode of said memory cell is controlled according to the operation of the first and second PMOS transistors in which said program enable signal is input.

* * * * *